United States Patent
Urakami et al.

(10) Patent No.: US 9,051,663 B2
(45) Date of Patent: Jun. 9, 2015

(54) MANUFACTURING METHOD OF SILICON CARBIDE SINGLE CRYSTAL

(75) Inventors: Yasushi Urakami, Obu (JP); Ayumu Adachi, Toyota (JP); Itaru Gunjishima, Aichi-gun (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 863 days.

(21) Appl. No.: 13/305,019

(22) Filed: Nov. 28, 2011

(65) Prior Publication Data
US 2012/0132132 A1 May 31, 2012

(30) Foreign Application Priority Data
Nov. 29, 2010 (JP) ................................ 2010-265805

(51) Int. Cl.
C30B 23/00 (2006.01)
C30B 29/36 (2006.01)
C30B 23/02 (2006.01)
H01L 29/16 (2006.01)

(52) U.S. Cl.
CPC ............. C30B 29/36 (2013.01); H01L 29/1608 (2013.01); C30B 23/00 (2013.01); C30B 23/025 (2013.01)

(58) Field of Classification Search
None
See application file for complete search history.

(56) References Cited

U.S. PATENT DOCUMENTS

| | | | |
|---|---|---|---|
| 5,958,132 A | 9/1999 | Takahashi et al. | |
| 7,316,747 B2 * | 1/2008 | Jenny et al. | 117/86 |
| 8,936,682 B2 * | 1/2015 | Urakami et al. | 117/106 |
| 2003/0070611 A1 | 4/2003 | Nakamura et al. | |
| 2005/0211156 A1 * | 9/2005 | Gunjishima et al. | 117/2 |
| 2012/0073495 A1 * | 3/2012 | Urakami et al. | 117/106 |
| 2014/0027787 A1 * | 1/2014 | Gunjishima et al. | 257/77 |
| 2014/0091325 A1 * | 4/2014 | Gunjishima et al. | 257/77 |
| 2014/0291700 A1 * | 10/2014 | Gunjishima et al. | 257/77 |

FOREIGN PATENT DOCUMENTS

| | | |
|---|---|---|
| JP | A-8-143396 | 6/1996 |
| JP | 2004262709 A * | 9/2004 |
| JP | 2006225232 A * | 8/2006 |
| JP | 2008053343 A * | 3/2008 |
| JP | 2010235390 A * | 10/2010 |
| JP | 2011233932 A * | 11/2011 |

OTHER PUBLICATIONS

U.S. Appl. No. 13/210,513, filed Aug. 16, 2011, Urakami et al.

* cited by examiner

*Primary Examiner* — Anita Alanko
(74) *Attorney, Agent, or Firm* — Posz Law Group, PLC (57) ABSTRACT

A manufacturing method of a SiC single crystal includes a first growth process and a re-growth process. In the first growth process, a first seed crystal made of SiC is used to grow a first SiC single crystal. In the re-growth process, a plurality of growth steps is performed for (n−1) times. In a k-th growth step, a k-th seed crystal is cut out from a grown (k−1)-th SiC single crystal, and the k-th seed crystal is used to grow a k-th SiC single crystal (n≥2 and 2≤k≤n). When an offset angle of a growth surface of the k-th seed crystal is defined as $\theta_k$, at least in one of the plurality of growth steps, the offset angle $\theta_k$ is smaller than the offset angle $\theta_{k-1}$.

14 Claims, 7 Drawing Sheets

MANUFACTURING METHOD OF SILICON CARBIDE SINGLE CRYSTAL

CROSS REFERENCE TO RELATED APPLICATION

This application is based on Japanese Patent Application No. 2010-265805 filed on Nov. 29, 2010, the disclosure of which is incorporated herein by reference.

TECHNICAL FIELD

The present invention relates to a manufacturing method of a silicon carbide single crystal.

BACKGROUND

Silicon carbide (SiC) includes high-temperature SiC (α-SiC) that has a hexagonal crystal structure and low-temperature SiC (β-sic) that has a cubic crystal structure. Compared with Si, SiC has a higher thermostability, and also has a wider bandgap, which contributes to a high electric breakdown field intensity. Therefore, a semiconductor device formed of a SiC single crystal is expected as a candidate material of a next generation power device to replace a semiconductor device formed of Si. Specifically, the α-SiC is attractive for a semiconductor material of an ultra-low power loss device because the α-SiC has a wider bandgap than the β-SiC.

The α-SiC has a {0001} plane, a {1-100} plane and a {11-20} plane, which are perpendicular to the {0001} plane, as main crystal planes. Hereafter, the {0001} plane is also referred to as a c-plane, and the {1-100} plane and the {11-20} plane are also referred to as a-planes generically.

A c-plane growth method is known as a manufacturing method of the α-SiC single crystal. In the c-plane growth method, a SiC single crystal having a predetermined exposed plane as a growth surface is used as a seed crystal. The predetermined exposed plane may be the c-plane or a plane whose offset angle from the c-plane is within a predetermined range. Then, on the growth surface of the seed crystal, a new SiC single crystal is grown by a method such as a sublimation recrystallization method.

However, the single crystal manufactured by the c-plane growth method has great amount of defects including defects such as micropipe defects (pipe-like void having a diameter of several μm to 100 μm) generated in a direction parallel to a <0001> direction and c-axis threading screw dislocations.

To manufacture a SiC power device having a high performance, a leakage current generated in a SiC semiconductor should be reduced. It is considered that an increase in the leakage current is caused by the micropipe defects and threading screw dislocations generated in the SiC single crystal.

Various conventional methods are disclosed to reduce above-described defects.

For example, JP-A-H05-262599 (corresponding to U.S. Pat. No. 5,958,132, hereafter referred to as patent document No. 1) discloses a growth method of the SiC single crystal. In this growth method (hereafter referred to as an a-plane growth method), a seed crystal, in which a plane (for example, the {1-100} plane or the {11-20} plane) inclined at an angle within approximately 60° to 120° from the c-plane is exposed as a growth surface, is used to grow the SiC single crystal.

Further, the patent document No. 1 discloses:
(1) when SiC is grown on a crystal plane inclined at an angle within approximately 60° to 120° from the c-plane, atom stacking arrangement is shown on the crystal plane, and therefore, a crystal having the same polytype with the seed crystal is easily grown;
(2) the threading screw dislocations are not generated by this growth method; and
(3) in a case where the seed crystal includes a dislocation having a slip plane on the c-plane, the dislocation will be transferred to the growing crystal.

JP-A-08-143396 (hereafter referred to as patent document No. 2) discloses another growth method of a SiC single crystal. In this growth method, SiC is grown on a seed crystal having a {10-10} plane as the growth surface, and then a {0001} wafer is cut out from the grown single crystal. New SiC is grown using the {0001} wafer as a new seed crystal.

Further, the patent document No. 2 discloses:
(1) a SiC single crystal grown by this method has small amount of micropipe defects; and
(2) a sufficiently large {0001} wafer, which is larger than a wafer obtained from a Acheson crystal, is obtained so that a bulk crystal is easily grown using the {0001} wafer as a seed crystal by this method.

JP-A-2003-119097 and JP-A-2003-321298 (corresponding to US 2003/0070611, hereafter referred to as patent documents No. 3 and No. 4) disclose another growth method of a SiC single crystal. In this growth method, the a-plane growth is performed multiple times in a mutually perpendicular direction, and then the c-plane growth is performed at the end.

Further, the patent document No. 3 discloses:
(1) dislocation density in the growing crystal is reduced exponentially with an increasing number of a-plane growth times;
(2) stacking faults are inevitably generated during the a-plane growth; and
(3) the SiC single crystal grown in this method has no micropipe defects or threading screw dislocations, and has very small amount of stacking faults because of the c-plane growth, which is performed at the end.

JP-A-2004-323348 (corresponding to US 2005/0211156 hereafter referred to as patent document No. 5) discloses another growth method of a SiC single crystal. In this growth method, a dislocation control seed crystal is used to grow SiC. The dislocation control seed crystal has a growth surface, which has an offset angle of within 60° from the {0001} plane, and a region that is capable of generating the threading screw dislocations and is formed on the growth surface.

Further, the patent document No. 5 discloses the threading screw dislocations are generated with certainty in a region formed by c-plane facets during the c-plane growth. Therefore, a generation of heterogeneous polymorphous crystals and different surface orientation crystals is restricted.

The a-plane growth method has an advantage of growing a SiC single crystal having a low density of the threading screw dislocations. However, in the SiC single crystal grown by the a-plane growth method, the stacking faults are easily generated in a direction approximately parallel to the c-plane at a high density. When the stacking faults are generated in the SiC single crystal, an electric resistance in a direction that traverses the stacking faults will increase. Therefore, the SiC single crystal having the stacking faults at a high density may not be used as a semiconductor material for power devices.

It is considered that a SiC single crystal, which has very small amount of threading screw dislocations and stacking faults, may be manufactured by performing the a-plane growth at least one time after performing the c-plane growth.

However, a seed crystal manufactured from a crystal grown by the a-plane growth has very small amount of threading screw dislocations. Therefore, the seed crystal has no step providing source, which transfers polymorphism of the seed crystal to the growing crystal, in a c-lane facet, which is formed on a surface of the growing crystal during the c-plane growth. Accordingly, the heterogeneous polymorphous crystals and the different surface orientation crystals may be generated partially on the c-plane facet. Further, new threading screw dislocations may be randomly generated in the growing crystal with a growth of the heterogeneous polymorphous crystals and the different surface orientation crystals.

Regarding difficulties described above, the patent document No. 5 discloses a growth method in which the dislocation control seed crystal, which has the region capable of generating the threading screw dislocations, is used to grow the SiC single crystal from a beginning of the growth to restrict the generation of the heterogeneous polymorphous crystals and the different surface orientation crystals.

However, it is known by a detailed evaluation that a relatively large amount of the threading screw dislocations may be generated on an interface between the seed crystal and the growing crystal even when the seed crystal has very small amount of threading screw dislocations in the <0001> direction.

In a case where the growth surface has a relatively large offset angle, the generation of the threading screw dislocations is restricted on the interface between the seed crystal and the growing crystal. However, in this case, it is known that the stacking faults (including basal surface threading edge dislocations), which are transferred from the threading screw dislocation generation region in a downstream offset direction, are easily generated. The threading screw dislocation generation region is formed to restrict the generation of the heterogeneous polymorphous crystals. This problem becomes significant with an increasing offset angle. It is also known that when the threading screw dislocation generation region is processed to disarrange the crystal structure, a density of generated stacking faults will increase.

As described above, the threading screw dislocations generated during the growth with a relatively small offset angle, and the stacking faults generated during the growth with a relatively large offset angle are in a trade-off relationship, and a growth of high-performance SiC is inhibited by this trade-off relationship.

SUMMARY

In view of the foregoing problems, it is an object of the present invention to provide a manufacturing method of a high-performance SiC single crystal with a low potential of generating defects, such as heterogeneous polymorphous crystals, stacking faults and threading screw dislocations.

According to a first aspect of the present disclosure, a manufacturing method of a SiC single crystal includes a first growth process and a re-growth process. In the first growth process, a first seed crystal made of SiC is used to grow a first SiC single crystal. In the re-growth process, a plurality of growth steps are performed for (n−1) times. In a k-th growth step, a k-th seed crystal is cut out from a grown (k−1)-th SiC single crystal, and the k-th seed crystal is used to grow a k-th SiC single crystal. The n is natural number and is equal to or larger than 2, and the k is natural number and is in a range between 2 and n. When an offset angle of a growth surface of the first seed crystal is defined as $\theta_1$, the offset angle $\theta_1$ is larger than 4 degrees and equal to or smaller than 30 degrees. When an offset angle of a growth surface of the k-th seed crystal is defined as $\theta_k$, at least in one of the plurality of growth steps, the offset angle $\theta_k$ is smaller than the offset angle $\theta_{k-1}$. The offset angle $\theta_n$ is smaller than the offset angle $\theta_1$. Each of the first to n-th seed crystals has a threading screw dislocation generation region formed on an uppermost portion of the upstream side in the offset direction.

In the above-described manufacturing method, a high-performance SiC single crystal, in which defects such as stacking faults and threading screw dislocations are reduced, can be obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

The present disclosure relates to a manufacturing method of a silicon carbide single crystal, which has small amount of faults. Embodiments of the present disclosure will be described.

[1.1. Growth Surface]

A growth surface is a surface of a seed crystal to grow a new single crystal, and is formed of SiC. For example, when a SiC single crystal is grown by a sublimation recrystallization method, the seed crystal is disposed at a low-temperature portion of a crucible, and SiC raw material is disposed at a high-temperature portion of the crucible. The SiC raw material is sublimated to SiC gas and is recrystallized on the surface of the seed crystal. In this case, the "growth surface" is a surface of the seed crystal, and has a normal vector having a component in a crucible central axis direction. The "crucible central axis direction" is a direction from the SiC seed crystal to the raw material, and is parallel to a central axis of the crucible. That is, the "crucible central axis direction" shows a macro growth direction of the SiC single crystal. Typically, the "central axis direction" is perpendicular to a bottom surface of the SiC seed crystal or a bottom surface of a seed crystal pedestal to which the SiC seed crystal is fixed.

In the present disclosure, the growth surface of the seed crystal is virtually formed of a single plane.

The "single plane" is a plane which has a predetermined offset angle. For example, when the seed crystal has a plate-like shape such as a polygonal plate or a circular plate, the "growth surface" corresponds to an upper surface of the plate. For example, the seed crystal has a pyramid-like shape such as a circular cone or a multiangular pyramid, the "growth surface" corresponds to a conical surface or a pyramidal surface.

A "virtually single plane" is a plane which may include sub-planes having different offset angles on a part of the growth surface. For example, the planes having different offset angles may be formed by chamfering an upper corner part of a plate. However, when a ratio of the planes having different offset angles to the whole growth surface increases, a processing of the seed crystal becomes more complicated. Therefore, when a total area of the growth surface is $S_0$, and an area of a maximum plane having a predetermined offset angle is $S_1$, a ratio $(=S_1 \times 100/S_0 (\%))$ of the area of the maximum plane having the predetermined offset angle to the area of the growth surface may be set to 90% or greater.

[1.2. Offset Angle, Offset Direction]

An "offset angle of the growth surface" is an angle between a normal vector of a growth surface, which is the maximum plane having a predetermined offset angle, and the normal vector of the {0001} plane of the SIC seed crystal.

An "offset direction" is a direction of a projected vector defined by projecting a normal vector of the {0001} plane in a growth direction on the growth surface.

An "upstream side in the offset direction" is a side to which the projected vector defined by projecting the normal vector of the {0001} plane in the growth direction on the growth surface points.

A "downstream side in the offset direction" is an opposite side to which the projected vector defined by projecting the normal vector of the {0001} plane in the growth direction on the growth surface points.

An "uppermost portion of the upstream side in the offset direction" is a portion at which a crystallographically uppermost {0001} plane located at the side to which the projected vector defined by projecting the normal vector of the {0001} plane in the growth direction on the growth surface points.

A "lowermost portion of the downstream side in the offset direction" is a portion at which a crystallographically lowermost {0001} plane located at the opposite side to which the projected vector defined by projecting the normal vector of the {0001} plane in the growth direction on the growth surface points.

An "offset inclined direction on the {0001} plane" is a side to which a projected vector defined by projecting a vector from the lowermost portion of the downstream side in the offset direction to the uppermost portion of the upstream side in the offset direction on the c-plane points.

A manufacturing method of the SiC single crystal according to the present disclosure includes a first growth process and a re-growth process.

[2.1. First Growth Process]

In the first growth process, a first seed crystal is used to grow a first SiC single crystal.

[2.1.1 Single Crystal from which the First Seed Crystal is Cut Out]

A thermal history of the SiC single crystal from which the first seed crystal is cut out to be used at a start of the growth may be selected according to an intended purpose without limitation. That is, since the manufacturing method according to the present disclosure is about obtaining a high-performance single crystal from a low-performance seed crystal, the first seed crystal does not have to be a high-performance single crystal.

As the SiC single crystal from which the first seed crystal is cut out, for example, a SiC single crystal listed below may be used.

(a) A SiC single crystal having a relatively high density of stacking faults and grown by the a-plane growth method.

(b) A SiC single crystal having a relatively high density of the threading screw dislocations and grown by a c-plane growth method.

(c) A SiC single crystal having a relatively low density of faults and grown by the repeated a-plane growth method first and then the c-plane growth method.

(d) A SiC single crystal having relatively large amount of the stacking faults, which are transferred from a single crystal grown by the a-plane growth method, and grown by the repeated a-plane growth method first and then the c-plane growth method.

(e) A SiC single crystal having a high density of the threading screw dislocations, which are generated in a threading screw dislocation generation region, and grown by the c-plane growth method using a seed crystal on which the threading screw dislocation generation region is formed.

[2.1.2 Offset Angle $\theta_1$ of the First Seed Crystal]

When the offset angle $\theta_1$ of the first seed crystal is too small, relatively large amount of the threading screw dislocations may be generated on an interface between the seed crystal and the growing crystal. Additionally, a converting from basal surface threading edge dislocations to the threading screw dislocations in the seed crystal is restricted more effectively with an increasing offset angle $\theta_1$. Accordingly, the offset angle $\theta_1$ of the first seed crystal needs to be $\theta_1 > 4°$. The offset angle $\theta_1$ of the first seed crystal may also be $\theta_1 \geq 8°$.

However, when the offset angle $\theta_1$ is too large, the stacking faults transferred from the first seed crystal to the growing crystal are removed to the outside of the growing crystal, and thus a growth height of the growing crystal needs to be increased. Additionally, when the offset angle $\theta_1$ is too large, new stacking faults may be generated in the growing crystal. Accordingly, the offset angle $\theta_1$ needs to be $\theta_1 \leq 30°$.

When the SiC single crystal having relatively large amount of the stacking faults is used as the SiC single crystal from which the seed crystal is cut out, the stacking faults may be exposed on a cutting surface according to a cutting position and the offset angle $\theta_1$. Even this kind of SiC single crystal may be used as the first seed crystal to grow the high-performance SiC single crystal in the present disclosure.

Additionally, in a case where the first seed crystal has exposed stacking faults on the growth surface, the first seed crystal may be cut out in such a manner that a region of the exposed stacking faults are located outside of the threading screw dislocation generation region, which is to be described below. That is, the first seed crystal may be cut out in such a manner that the region of the exposed stacking faults is located at the downstream side in the offset direction of the growth surface. By this cutting method, the stacking faults are removed to the outside of the growing crystal at an early stage of the growth.

[2.1.3. Threading Screw Dislocation Generation Region]

The first seed crystal has the threading screw dislocation generation region at the uppermost portion of the upstream side in the offset direction.

The "threading screw dislocation generation region" is a region that provides a high density of the threading screw dislocations to a c-plane facet (c-plane at a forefront end of the growing crystal) so that a generation of the heterogeneous polymorphous crystals is restricted.

Specifically, methods of forming the threading screw dislocation generation region in the first seed crystal include:

(1) growing the SiC seed crystal by the a-plane growth method in such a manner that the region having a high density of the threading screw dislocations is remained (For example, see the patent document No. 5);

(2) performing a process to disarrange a crystal structure on a surface of the SiC seed crystal (For example, mechanical processing, ion implantation processing, laser processing);

(3) arranging a substrate including the threading screw dislocations at a high density in contact with the SiC seed crystal;

(4) providing a recessed portion (such as a dent or a portion with a different depth from the surface) at a surface portion of the seed crystal and preliminarily growing SiC at the recessed portion;

(5) growing the SiC seed crystal to have a shape so that only the downstream side in the offset direction has a large offset angle, and only the threading screw dislocations at the downstream side in the offset direction are removed to the outside of the growing crystal by repeating the c-plane growth method; and (6) performing a process to disarrange the crystal structure intentionally so that a density of the threading screw dislocations at the upstream side in the offset direction is maintained at a constant level when the density of the threading screw dislocations are decreased by methods such as stress relaxation in a seed crystal holder and an expansion growth to obtain a high-performance seed crystal.

In the forgoing methods of forming the threading screw dislocation generation region, the process to disarrange the crystal structure, specifically, by the mechanical processing, is relatively easy to be performed to form the threading screw dislocation generation region on the surface of the seed crystal.

Further, when the seed crystal already has the threading screw dislocation generation region transferred from a single crystal, the threading screw dislocation generation region may not be formed artificially on the seed crystal. However, when the threading screw dislocations, which are transferred from the single crystal, has a relatively low density, for example when a re-growth step is repeatedly performed in the re-growth process to be described below, the threading screw dislocation generation region may be formed artificially.

An area of the threading screw dislocation generation region may be set to a value according to an intended purpose without limitation. Generally, when the area of the threading screw dislocation generation region is too small, the c-plane facet is not sufficiently covered by the threading screw dislocation generation region. Thus, providing sufficient threading screw dislocations to the c-plane facet becomes difficult. Accordingly, the area of the threading screw dislocation generation region may be set to 2% or greater of the area of the growth surface. The area ratio of the threading screw dislocation generation region to the growth surface may also be set to 5% or greater.

When the area of the threading screw dislocation generation region increases, the threading screw dislocations are provided to the c-plane facet with certainty. However, when the area of the threading screw dislocation generation region is too large, a ratio of a high-quality region to the entire growing crystal decreases. Thus, the area of the threading screw dislocation generation region may be set to 50% or less of the area of the growth surface. The area ratio of the threading screw dislocation generation region to the growth surface may also be set to 30% or less. Further, the area ratio of the threading screw dislocation generation region to the growth surface may also be set to 200% or less.

[2.1.4. Manufacturing Method of the First SiC Seed Crystal]

Typically, a sublimation recrystallization method, a high-temperature solution deposition method and a CVD method are used to grow a SiC single crystal. In the present disclosure, any one of the growth methods may be used. Specifically, the sublimation recrystallization method is favorable when the first seed crystal is used to grow the first SiC single crystal.

Manufacturing conditions of the single crystal may be set appropriately without limitation according to the growth method.

Specifically, methods of controlling the c-plane facet to be generated at the upstream side in the offset direction include:

(a) setting an offset angle on the growth surface of the seed crystal (see the patent document No. 5);

(b) increasing heat radiation performance of a predetermined position at which the c-plane facet is generated on the growth surface; and (c) increasing a concentration of the sublimated gas.

By the method of setting the offset angle, the c-plane facet is generated with certainty at the early stage of the growth.

[2.2. Re-Growth Process]

In the re-growth process, a k-th ($2 \leq k \leq n$) seed crystal is cut out from a (k−1)-th SiC single crystal, the k-th seed crystal is used to grow a k-th SiC single crystal, and this k-th growth step is performed for (n−1) times ($n \geq 2$) in the re-growth process.

[2.2.1. Single Crystal from which the k-th Seed Crystal is Cut Out]

A SiC single crystal from which the k-th seed crystal is cut out is the (k−1)-th SiC single crystal in a prior growth step. When the k-th growth step is performed for (n−1) times, a high-quality seed crystal is manufactured from a low-quality seed crystal.

[2.2.2. Offset Angle $\theta_k$ of the k-th Seed Crystal]

To decrease both the stacking faults and the threading screw dislocations, in the re-growth process, a high offset angle ($\theta_{k-1}$) growth is performed at least one time, and then a low offset angle ($\theta_k$) growth is performed at least one time.

That is, in the (n−1) times ($n \geq 2$) of the k-th growth steps, an offset angle $\theta_k$ of a growth surface of the k-th ($2 \leq k \leq n$) seed crystal and an offset angle $\theta_{k-1}$ of a growth surface of a (k−1)-th seed crystal need to satisfy a relationship of $\theta_k < \theta_{k-1}$ at least one time.

Additionally, to substantially decrease both the stacking faults and the threading screw dislocations, in the re-growth process, the offset angle $\theta_k$ may be set to a smaller value in each of the growth steps compared with a prior growth step. That is, entire offset angles of (n−1) times ($n \geq 2$) of the k-th growth steps satisfy the relationship of $\theta_k < \theta_{k-1}$.

In the (n−1) times of the re-growth steps, when the offset angle $\theta_k$ is set to a smaller value in each of the growth steps compared with a prior growth step, an offset angle $\theta_n$ of a growth surface of a n-th seed crystal inevitably satisfies a relationship of $\theta_n < \theta_1$.

In the (n−1) times of the re-growth steps, when the high offset angle growth is performed at least one time and then the low offset angle growth is performed at least one time, offset angles of the other re-growth steps may be $\theta_k > \theta_{k-1}$ (that is, the high offset angle growth is performed after performing the low offset angle growth). However, in this case, the offset angle $\theta_n$ of the growth surface of the n-th seed crystal needs to satisfy the relationship of $\theta_n < \theta_1$. With this growth method, a transfer of the stacking faults to the growing crystal is restricted in a final (n-th) growth step.

To obtain a single crystal having a small amount of the stacking faults, the offset angle $\theta_n$ needs to be set to a small value. Specifically, the offset angle $\theta_n$ may be set to $\theta_n \leq 15°$, further may be set to $\theta_n \leq 8°$, further more may be set to $\theta_n \leq 4°$. Specifically, when the offset angle $\theta_n$ is set to $\theta_n \leq 4°$, very small amount of stacking faults are generated in the threading screw dislocation generation region.

When the offset angle $\theta_k$ of the k-th seed crystal is relatively small, stacking faults, which are transferred from the (k−1)-th seed crystal to the grown (k−1)-th SiC single crystal, may be exposed on the growth surface of the k-th seed crystal according to a cutting position of the k-th seed crystal and the offset angle $\theta_k$. When the k-th seed crystal having the stacking faults exposed on the growth surface is used to perform the low offset angle growth, the exposed stacking faults are easily converted to the threading screw dislocations.

Specifically, in the k-th (2≤k≤n) growth step, when the offset angle $\theta_k$ of the growth surface of the k-th seed crystal is 4° or less, the k-th seed crystal is cut out from the (k−1)-th single crystal in such a manner that the stacking faults, which are transferred from the (k−1)-th seed crystal to the grown (k−1)-th SiC single crystal, are not exposed on the growth surface of the k-th seed crystal.

[2.2.3. $\Delta\theta_n$]

To decrease both the threading screw dislocations and the stacking faults at the same time by performing the high offset angle growth and then performing the low offset angle growth, an angle difference $\Delta\theta_n$ ($\Delta\theta_n=\theta_n-\theta_1$) between the offset angles $\theta_n$ and $\theta_1$ needs to be set to a large value. Specifically, the angle difference $\Delta\theta_n$ may be set to $\Delta\theta_n \leq -2°$, further may be set to $\theta_n \leq -4°$.

[2.2.4. Threading Screw Dislocation Generation Region]

The k-th seed crystal has the threading screw dislocation generation region at the uppermost portion of the upstream side in the offset direction. Since details about the threading screw dislocation generation region are similar to the first embodiment, a description about the threading screw dislocation generation region is omitted.

[2.2.5. Growth Method of the k-th SiC Single Crystal]

Since detailed growth method of the k-th SiC single crystal is similar to the growth method of the first SIC single crystal, the growth method of the k-th SiC single crystal is omitted.

[2.2.6. Cutting Direction of the k-th Seed Crystal]

To decrease both the threading screw dislocations and the stacking faults at the same time, each of the k-th seed crystals needs to be cut out in such a manner that the upstream side in the offset direction and the downstream side in the offset direction of the k-th seed crystal respectively coincide with the upstream side in the offset direction and the downstream side in the offset direction of the (k−1)-th seed crystal when seen a direction perpendicular to the {0001} plane. When a difference in the offset inclined direction increases, more stacking faults, which are transferred from the (k−1)-th seed crystal to the grown (k−1)-th SiC single crystal, are exposed on the growth surface of the k-th seed crystal.

That is, in the (n−1) times (n≥2) of the re-growth steps, an angle difference between each offset inclined direction on the c-plane of the k-th (2≤k≤n) seed crystal and each offset inclined direction on the c-plane of the (k−1)-th seed crystal may be set to within a range of ±45°.

Further, in the (n−1) times (n≥2) of the re-growth steps, an angle difference between each offset inclined direction on the c-plane of the k-th (2≤k≤n) seed crystal and each offset inclined direction on the c-plane of the (k−1)-th seed crystal may be set to within a range of ±30°.

Further more, in the (n−1) times (n≥2) of the re-growth steps, an angle difference between each offset inclined direction on the c-plane of the k-th (2≤k≤n) seed crystal and each offset inclined direction on the c-plane of the (k−1)-th seed crystal may be set to within a range of ±10°.

3. EMBODIMENTS

3.1 First Embodiment

Figure 1A:
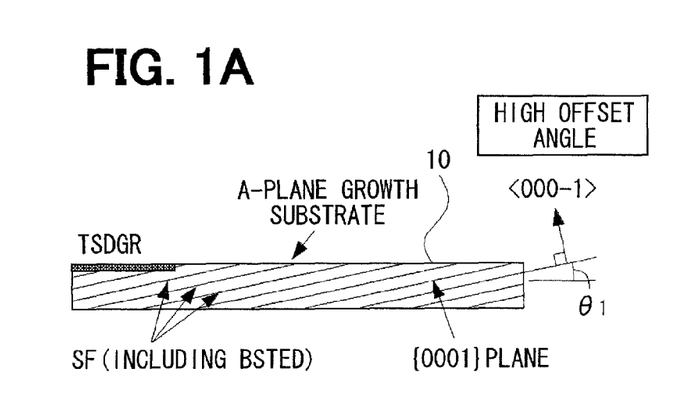
FIGS. 1A to 1D are diagrams showing a manufacturing method of SiC single crystal according to a first embodiment of the present disclosure.

FIG. 1A shows a cross-sectional view of the first seed crystal. A first seed crystal 10 shown in FIG. 1A has a bottom surface, which is not parallel to the {0001} plane, and is a so-called "offset substrate". The first seed crystal 10 has a relatively large offset angle $\theta_1$ and is a high offset angle substrate. The first seed crystal 10 is a plate-like seed crystal (a-plane growth substrate), which is cut out from a crystal grown by the a-plane growth method. Therefore, the first seed crystal 10 has relatively large amount of the stacking faults (SF) including basal surface threading edge dislocations (BSTED) generated in parallel to the {0001} plane. Further, the first seed crystal 10 has the threading screw dislocation generation region (TSDGR), which is formed at the uppermost portion of the upstream side in the offset direction.

Figure 1B:
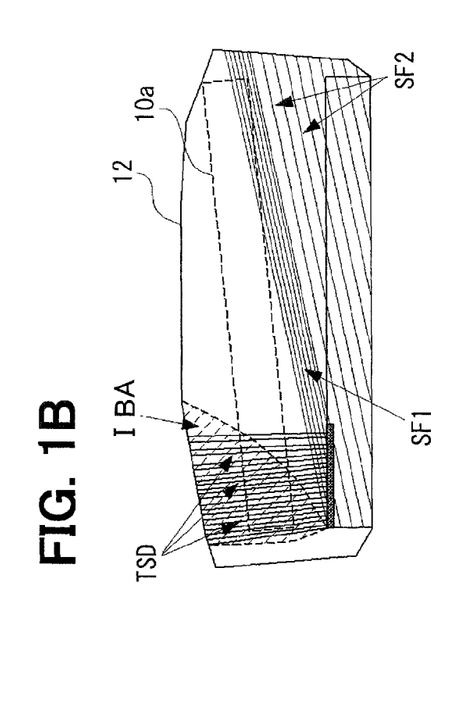

When the first seed crystal 10 described above is used in a first growth (first growth step), a first SiC single crystal 12 (growing crystal) shown in FIG. 1B is obtained. During the growth, the threading screw dislocations (TSD) having a relatively high density are generated in the threading screw dislocation generation region, and are provided to the c-plane facet shown by arrow IBA in FIG. 1B. As a result, the generation of the heterogeneous polymorphous crystals due to insufficient threading screw dislocations in the c-plane facet is restricted.

However, in the high offset angle growth, when the threading screw dislocation generation region (artificially generated fault portion) is formed on the surface of the first seed crystal 10, a high density of the stacking faults (shown by arrow SF1 in FIG. 1B) are generated in the artificially generated fault portion. Additionally, the stacking faults (shown by arrow SF2 in FIG. 1B) originally included in the first seed crystal 10 are transferred into the growing crystal, and are removed to the outside of the growing crystal. That is, the first SiC single crystal 12 has relatively large amount of the stacking faults.

Figure 1C:
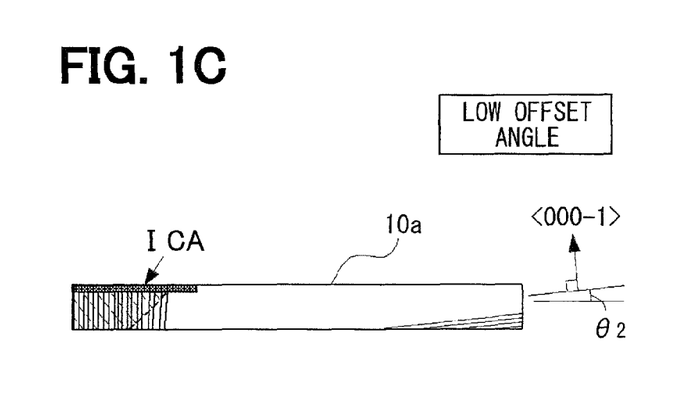

Next, a second seed crystal 10a is cut out from the first SiC single crystal 12 in such a manner that the offset angles $\theta_2$ and $\theta_1$ satisfy a relationship of $\theta_2 < \theta_1$ and the offset inclined directions are coincident with each other. FIG. 1C shows a cross-sectional view of the cutout second seed crystal 10a. The second seed crystal 10a shown in FIG. 1C has a relatively small offset angle $\theta_2$, and is the low offset angle substrate. Additionally, as shown in FIG. 1C, when the growth height of the first SiC single crystal 12 and the cutting position of the second seed crystal 10a are appropriately set, the stacking faults, which are transferred to the first SiC single crystal 12, are not exposed on the growth surface of the second seed crystal 10a. Further, the second seed crystal 10a has a high density of the threading screw dislocations, which are transferred from the first SiC single crystal 12, at the uppermost portion of the upstream side in the offset direction. Therefore, the cutout second seed crystal 10a may be used as a seed crystal without any treatment. Alternatively, the cutout second seed crystal 10a may also be further treated to distort crystal lattices at the uppermost portion of the upstream side in the offset direction as shown by arrow ICA in FIG. 1C.

Figure 1D:
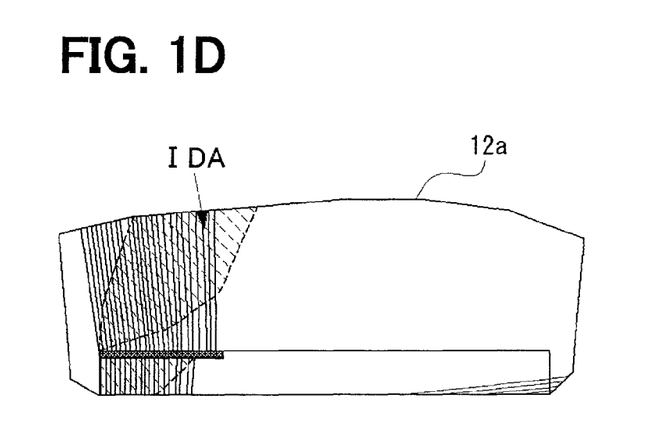

When the second seed crystal 10a described above is used in a second growth (second growth step), a second SiC single crystal 12a shown in FIG. 1D is obtained. During the growth, the threading screw dislocations having a relatively high density are generated in the threading screw dislocation generation region, and are provided to the c-plane facet shown by arrow IDA in FIG. 1D. As a result, the generation of the heterogeneous polymorphous crystals due to insufficient threading screw dislocations in the c-plane facet is restricted.

Additionally, when the artificially generated fault portion is formed on the surface of the second seed crystal 10a, since the offset angle $\theta_2$ is small, the stacking faults, which are converted from some of the threading screw dislocations generated in the artificially generated fault portion, will not flow to the downstream side in the offset direction. Further, in the first growth step, most of the stacking faults are removed to the outside of the growing crystal, the high-quality region formed at the downstream side in the offset direction has small amount of the stacking faults exposed on the surface of the high-quality region. Therefore, a probability of the generation of the threading screw dislocations on the interface between the seed crystal and the growing crystal is low.

3.2 Second Embodiment

Figure 2A:
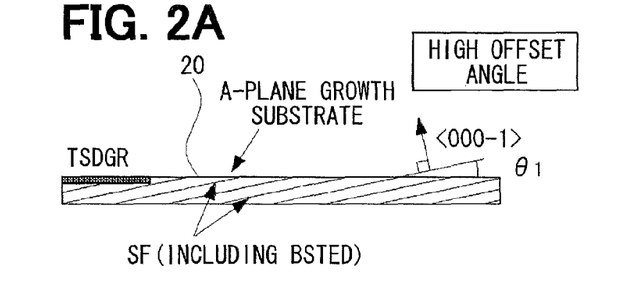
FIGS. 2A to 2F are diagrams showing a manufacturing method of SiC single crystal according to a second embodiment of the present disclosure.

FIG. 2A shows a cross-sectional view of the first seed crystal. A first seed crystal 20 shown in FIG. 2A has a bottom surface, which is not parallel to the {0001} plane, and is a so-called "offset substrate". The first seed crystal 20 has a relatively large offset angle $\theta_1$ and is the high offset angle substrate. The first seed crystal 20 is a plate-like seed crystal (a-plane growth substrate), which is cut out from the crystal grown by the a-plane growth method. Therefore, the first seed crystal 20 has relatively large amount of the stacking faults (SF) including basal surface threading edge dislocations (BSTED) generated in parallel to the {0001} plane. Further, the first seed crystal 20 has the threading screw dislocation generation region (TSDGR), which is formed at the uppermost portion of the upstream side in the offset direction.

Figure 2B:
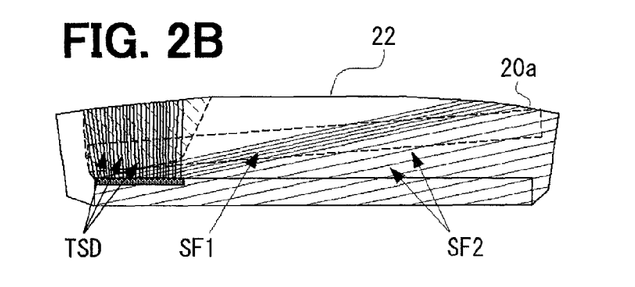

When the first seed crystal 20 described above is used in a first growth (first growth step), a first SiC single crystal 22 shown in FIG. 2B is obtained. During the growth, the threading screw dislocations (TSD) having a relatively high density are generated in the threading screw dislocation generation region, and are provided to the c-plane facet. As a result, the generation of the heterogeneous polymorphous crystals due to insufficient threading screw dislocations in the c-plane facet is restricted.

However, in the high offset angle growth, when the threading screw dislocation generation region (artificially generated fault portion) is formed on the surface of the first seed crystal 20, a high density of the stacking faults (shown by arrow SF1 in FIG. 2B) are generated in the artificially generated fault portion. Additionally, the stacking faults (shown by arrow SF2 in FIG. 2B) originally included in the first seed crystal 20 are transferred into the growing crystal, and are removed to the outside of the growing crystal. That is, the first SiC single crystal 22 has relatively large amount of the stacking faults.

Figure 2C:
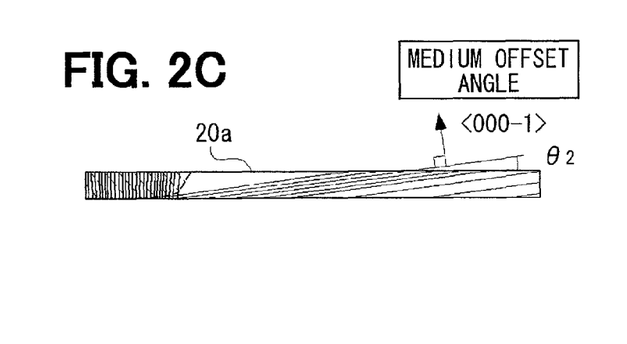

Next, a second seed crystal 20a is cut out from the first SiC single crystal 22 in such a manner that the offset angles $\theta_2$ and $\theta_1$ satisfy a relationship of $\theta_2<\theta_1$ and the offset inclined directions are coincident with each other. FIG. 2C shows a cross-sectional view of the cutout second seed crystal 20a. The second seed crystal 20a shown in FIG. 2C has a medium offset angle $\theta_2$, and is a medium offset angle substrate. Additionally, as shown in FIG. 2C, when the growth height of the first SiC single crystal 22 and the cutting position of the second seed crystal 20a are appropriately set, the stacking faults, which are transferred to the first SiC single crystal 22, are exposed on the growth surface of the second seed crystal 20a. Further, the second seed crystal 20a has a high density of the threading screw dislocations, which are transferred from the first SiC single crystal 22, at the uppermost portion of the upstream side in the offset direction. Therefore, the cutout second seed crystal 20a is used as a seed crystal without any treatment as shown in FIG. 2C.

Figure 2D:
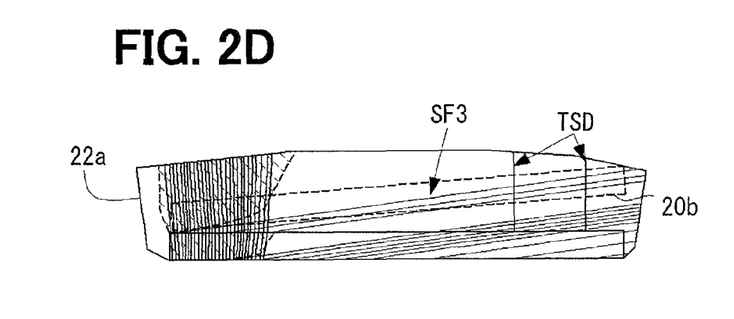

When the second seed crystal 20a described above is used in a second growth (second growth step), a second SiC single crystal 22a shown in FIG. 2D is obtained. During the growth, the threading screw dislocations having a relatively high density are generated in the threading screw dislocation generation region, and are provided to the c-plane facet. As a result, the generation of the heterogeneous polymorphous crystals due to insufficient threading screw dislocations in the c-plane facet is restricted.

Additionally, when the artificially generated fault portion is not formed on the surface of the second seed crystal 20a, since the offset angle $\theta_2$ is relatively large, the stacking faults (shown by arrow SF3 in FIG. 2D), which are converted from some of the threading screw dislocations generated in the threading screw dislocation generation region, will flow to the downstream side in the offset direction. Further, most of the stacking faults exposed on the growth surface of the second seed crystal 20a are removed to the outside of the growing crystal. However, some of the stacking faults exposed on the growth surface of the second seed crystal 20a are converted to the threading screw dislocations (TSD), and transferred to the growing crystal.

Figure 2E:
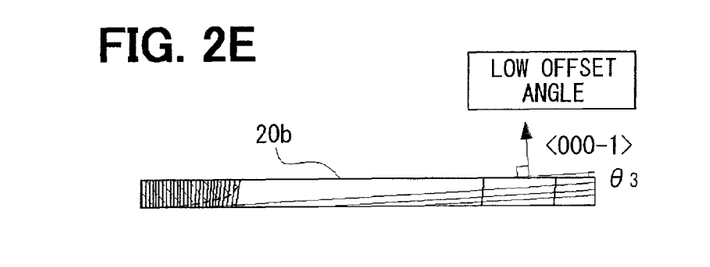

Next, a third seed crystal 20b is cut out from the second SiC single crystal 22a in such a manner that the offset angles $\theta_3$ and $\theta_2$ satisfy a relationship of $\theta_3<\theta_2$ and the offset inclined directions are coincident with each other. FIG. 2E shows a cross-sectional view of the cutout third seed crystal 20b. The third seed crystal 20b shown in FIG. 2E has a relatively small offset angle $\theta_3$, and is the low offset angle substrate. Additionally, as shown in FIG. 2E, when the growth height of the second SiC single crystal 22a and the cutting position of the third seed crystal 20b are appropriately set, the stacking faults, which are transferred to the second SiC single crystal 22a, are not exposed on the growth surface of the third seed crystal 20b. Further, the third seed crystal 20b has a high density of the threading screw dislocations, which are transferred from the second SiC single crystal 22a, at the uppermost portion of the upstream side in the offset direction. Therefore, the cutout third seed crystal 20b is used as a seed crystal without any treatment as shown in FIG. 2E.

Figure 2F:
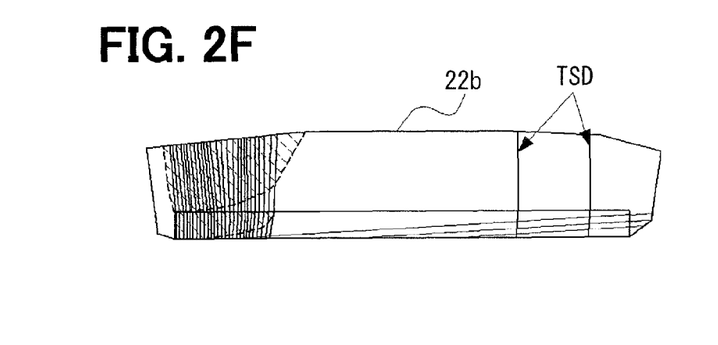

When the third seed crystal 20b described above is used in a third growth (third growth step), a third SiC single crystal 22b shown in FIG. 2F is obtained. During the growth, the threading screw dislocations having a relatively high density are generated in the threading screw dislocation generation region, and are provided to the c-plane facet. As a result, the generation of the heterogeneous polymorphous crystals due to insufficient threading screw dislocations in the c-plane facet is restricted.

Additionally, since the offset angle $\theta_3$ is relatively small, the stacking faults, which are converted from some of the threading screw dislocations generated in the threading screw dislocation generation region, will not flow to the downstream side in the offset direction. Further, in the second growth step, most of the stacking faults are removed to the outside of the growing crystal, the high-quality region formed at the downstream side in the offset direction has small amount of the stacking faults exposed on the surface of the high-quality region. Therefore, the threading screw dislocations (TSD) generated in the high-quality region during the growth of the second SiC single crystal 22a are transferred to the growing crystal. However, a probability of the generation of new threading screw dislocations on the interface between the seed crystal and the growing crystal is low.

3.3. Third Embodiment

Figure 3A:
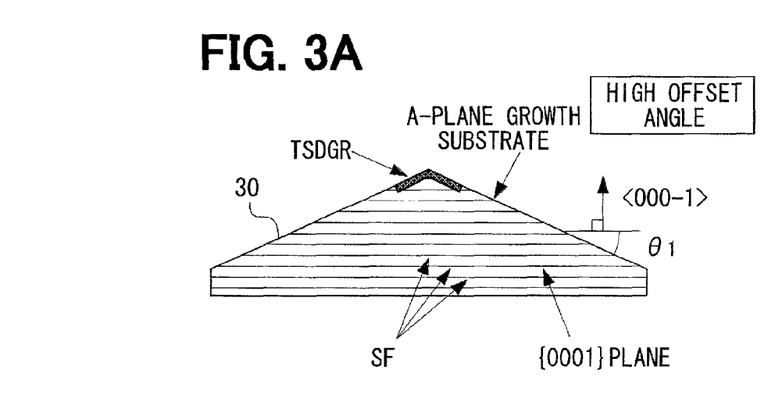
FIGS. 3A to 3D are diagrams showing a manufacturing method of SiC single crystal according to a second embodiment of the present disclosure.

FIG. 3A shows a cross-sectional view of the first seed crystal. A first seed crystal 30 shown in FIG. 3A has a bottom surface, which is parallel to the {0001} plane, and is a so-called "onset substrate". The first seed crystal 30 has a relatively large offset angle $\theta_1$ and is the high offset angle substrate. The first seed crystal 30 is a pyramid-like seed crystal (a-plane growth substrate), which is cut out from the crystal grown by the a-plane growth method. Therefore, the first seed crystal 30 has relatively large amount of the stacking faults (SF) including basal surface threading edge dislocations (BSTED) generated in parallel to the {0001} plane. Further, the first seed crystal 30 has the threading screw dislocation generation region (TSDGR), that is, the artificially generated fault portion, formed at the uppermost portion (that is, a top of the conical surface) of the upstream side in the offset direction.

Figure 3B:
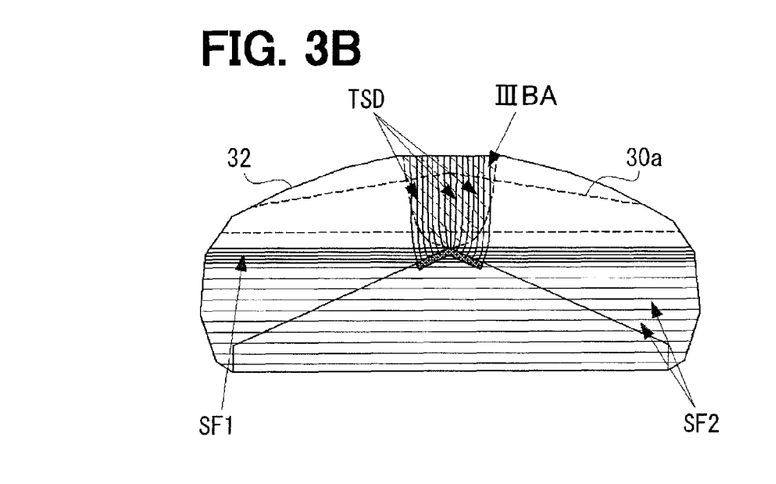

When the first seed crystal 30 described above is used in a first growth (first growth step), a first SiC single crystal 32 shown in FIG. 3B is obtained. During the growth, the threading screw dislocations (TSD) having a relatively high density are generated in the threading screw dislocation generation region, and are provided to the c-plane facet shown by arrow IIIBA in FIG. 3B. As a result, the generation of the heterogeneous polymorphous crystals due to insufficient threading screw dislocations in the c-plane facet is restricted.

However, in the high offset angle growth, when the threading screw dislocation generation region (artificially generated fault portion) is formed on the surface of the first seed crystal 30, a high density of the stacking faults (shown by arrow SF1 in FIG. 3B) are generated in the artificially generated fault portion. Additionally, the stacking faults (shown by arrow SF2 in FIG. 3B) originally included in the first seed crystal 30 are transferred into the growing crystal, and are removed to the outside of the growing crystal. That is, the first SiC single crystal 32 has relatively large amount of the stacking faults.

Figure 3C:
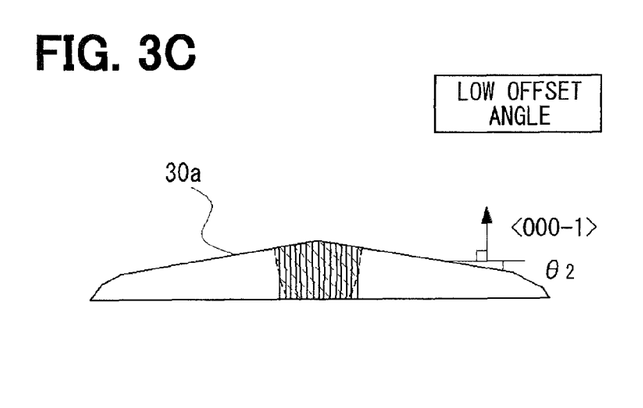

Next, a second seed crystal 30a is cut out from the first SiC single crystal 32 in such a manner that the offset angles $\theta_2$ and $\theta_1$ satisfy a relationship of $\theta_2 < \theta_1$ and the offset inclined directions are coincident with each other. FIG. 3C shows a cross-sectional view of the cutout second seed crystal 30a. The second seed crystal 30a shown in FIG. 3C has a relatively small offset angle $\theta_2$, and is the low offset angle substrate. Additionally, as shown in FIG. 3C, when the growth height of the first SiC single crystal 32 and the cutting position of the second seed crystal 30a are appropriately set, the stacking faults, which are transferred to the first SiC single crystal 32, are not exposed on the growth surface of the second seed crystal 30a. Further, the second seed crystal 30a has a high density of the threading screw dislocations, which are transferred from the first SiC single crystal 32, at the uppermost portion of the upstream side in the offset direction. Therefore, the cutout second seed crystal 30a is used as a seed crystal without any treatment as shown in FIG. 3C.

Figure 3D:
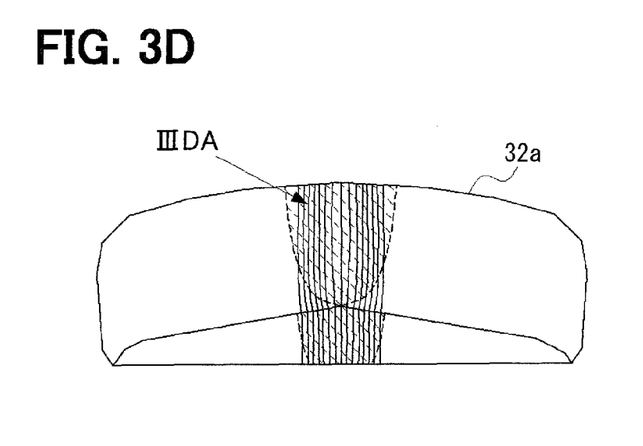

When the second seed crystal 30a described above is used in a second growth (second growth step), a second SiC single crystal 32a shown in FIG. 3D is obtained. During the growth, the threading screw dislocations having a relatively high density are generated in the threading screw dislocation generation region, and are provided to the c-plane facet shown by arrow IIIDA in FIG. 3D. As a result, the generation of the heterogeneous polymorphous crystals due to insufficient threading screw dislocations in the c-plane facet is restricted.

Additionally, since the offset angle $\theta_2$ of the second seed crystal 30a is relatively small, the stacking faults, which are converted from some of the threading screw dislocations generated in the threading screw dislocation generation region, will not flow to the downstream side in the offset direction. Further, in the first growth step, most of the stacking faults are removed to the outside of the growing crystal, the high-quality region formed at the downstream side in the offset direction has small amount of the stacking faults exposed on the surface of the high-quality region. Therefore, a probability of the generation of the threading screw dislocations on the interface between the seed crystal and the growing crystal is low.

[4.1. Low Offset Angle Growth]

Figure 4A:
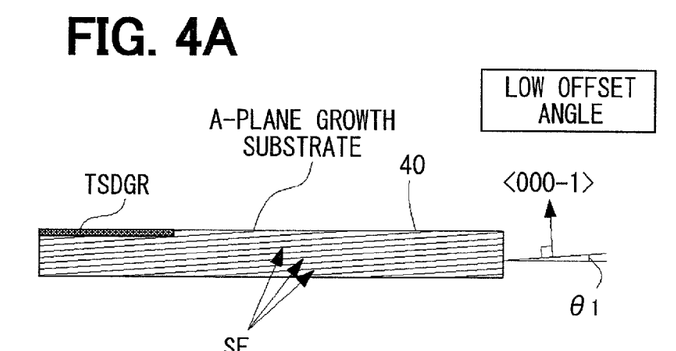
FIGS. 4A to 4D are diagrams showing an comparison example of manufacturing method of SiC single crystal in which an a-plane growth and a c-plane growth (low offset angle growth) are combined.

FIGS. 4A to 4D are diagrams showing a comparison example of a manufacturing method of a SiC single crystal in which the a-plane growth and the c-plane growth (low offset angle growth) are combined. FIG. 4A shows a cross-sectional view of the first seed crystal. A first seed crystal 40 shown in FIG. 4A has a bottom surface, which is not parallel to the {0001} plane, and is a so-called "offset substrate". The first seed crystal 40 has a relatively small offset angle $\theta_1$ and is the low offset angle substrate. The first seed crystal 40 is a plate-like seed crystal (a-plane growth substrate), which is cut out from the crystal grown by the a-plane growth method. Therefore, the first seed crystal 40 has relatively large amount of the stacking faults (SF) including basal surface threading edge dislocations (BSTED) generated in parallel to the {0001} plane. Further, the first seed crystal 40 has the threading screw dislocation generation region (TSDGR), that is, the artificially generated fault portion formed at the uppermost portion of the upstream side in the offset direction.

Figure 4B:
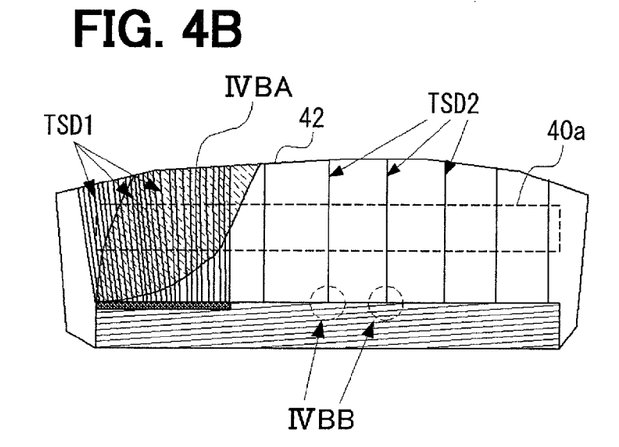

When the first seed crystal 40 described above is used in a first growth (first growth step), a first SiC single crystal 42 shown in FIG. 4B is obtained. During the growth, the threading screw dislocations (shown by arrow TSD1 in FIG. 4B) having a relatively high density are generated in the threading screw dislocation generation region, and are provided to the c-plane facet shown by arrow IVBA in FIG. 4B. As a result, the generation of the heterogeneous polymorphous crystals due to insufficient threading screw dislocations in the c-plane facet is restricted.

However, in the low offset angle growth, relatively large amount of the threading screw dislocations (shown by arrow TSD2 in FIG. 4B) may be generated on the interface between the seed crystal and the growing crystal, even though there are very small amount of threading screw dislocations in the seed crystal in a <0001> direction. The threading screw dislocations generated on the interface between the seed crystal and the growing crystal are converted (shown by arrow IVBB in FIG. 4B) from the stacking faults included in the first seed crystal 40.

Figure 4C:
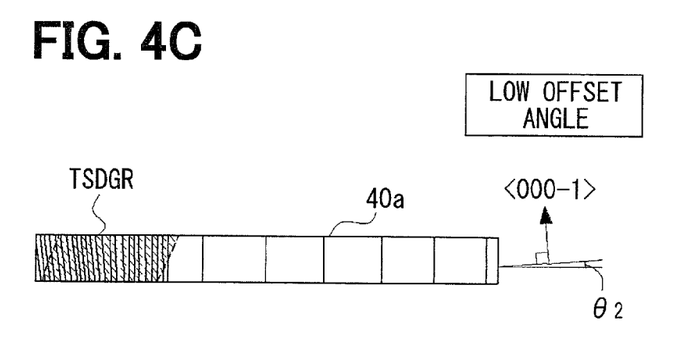

Next, a second seed crystal 40a is cut out from the first SiC single crystal 42 in such a manner that the offset angles $\theta_2$ and $\theta_1$ satisfy a relationship of $\theta_2 = \theta_1$ and the offset inclined directions are coincident with each other. FIG. 4C shows a cross-sectional view of the cutout second seed crystal 40a. The second seed crystal 40a shown in FIG. 4C has a relatively small offset angle $\theta_2$, and is the low offset angle substrate. Additionally, the second seed crystal 40a has a high density of the threading screw dislocations, which are transferred from the first SiC single crystal 42, at the uppermost portion of the upstream side in the offset direction. The uppermost portion of the upstream side in the offset direction provides the threading screw dislocation region (TSDGR).

Figure 4D:
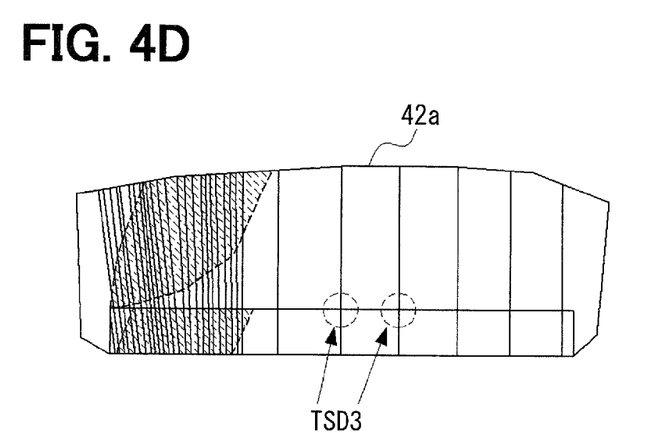

When the second seed crystal 40a described above is used in a second growth, a second SiC single crystal 42a shown in FIG. 4D is obtained. During the growth, the threading screw dislocations having a relatively high density are generated in the threading screw dislocation generation region, and are provided to the c-plane facet. As a result, the generation of the heterogeneous polymorphous crystals due to insufficient threading screw dislocations in the c-plane facet is restricted.

However, the threading screw dislocations (shown by arrow TSD3), which are generated in the high-quality region in the first growth step, are transferred to the growing crystal. Therefore, the manufacturing method, in which the a-plane growth and the c-plane growth (low offset angle growth) are combined, has a limitation in decreasing the density of the threading screw dislocations.

In the low offset angle growth, a reason for the generation of the threading screw dislocations on the interface between the seed crystal and the growing crystal even though there are very small amount of threading screw dislocations in the seed crystal, is considered as followings.

Figure 5A:
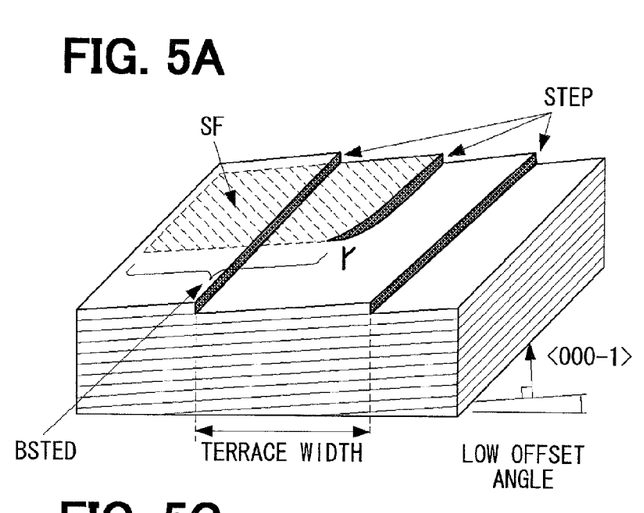
FIGS. 5A to 5D are diagrams showing growth steps during low offset angle growth.

As shown in FIGS. 5A to 5D, in the c-plane growth, SiC is sublimated on each step of the c-plane one step by one step. In the low offset angle growth, as shown in FIG. 5A, a distance (terrace width) between one c-plane step and another c-plane step formed thereon is large. Additionally, when the crystal has a stacking fault (SF) therein, a forefront of the stacking fault is exposed on a surface of the terrace, which has a large width.

Figure 5B:
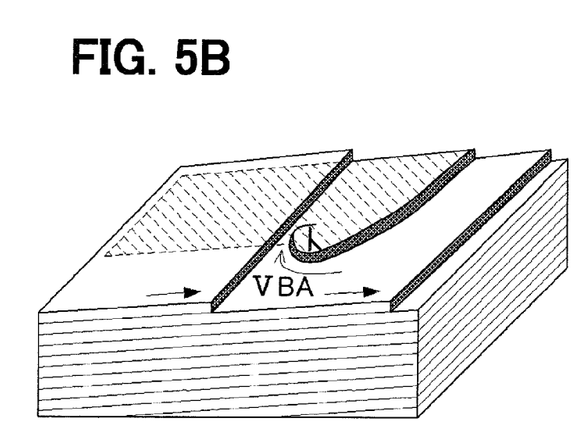
Figure 5C:
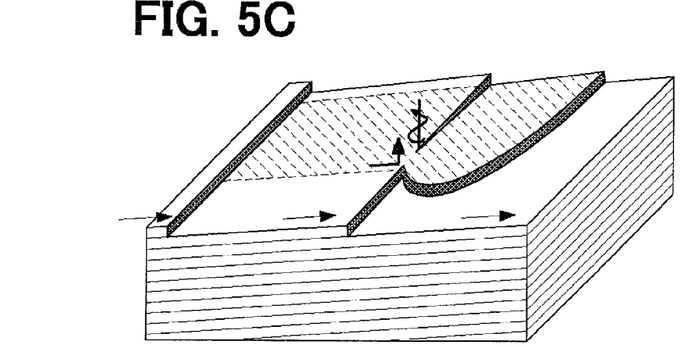
Figure 5D:
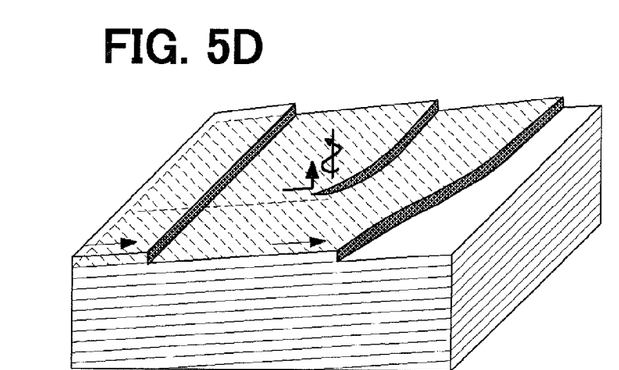

As shown in FIG. 5B, when the seed crystal described above is used in the c-plane growth, the forefront of the step of the stacking fault is spirally twisted as shown by arrow VBA in FIG. 5B. Further, as shown in FIG. 5C, with the growth of the crystal, the step having the stacking fault integrates with a subsequent step together. Further, as shown in FIG. 5D, with the growth of the crystal, a crystal plane having the stacking fault and a crystal plane of the subsequent step (high level) integrate into the same level, and the crystal plane is shaped to have a spiral structure. That is, the stacking fault converts to the threading screw dislocation.

[4.2. High Offset Angle Growth]

Figure 6A:
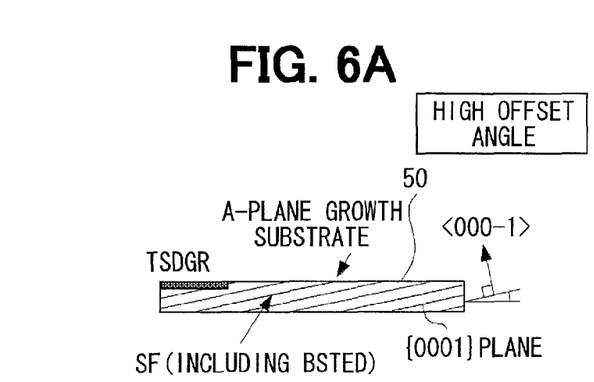
FIGS. 6A to 6F are diagrams showing an comparison example of a manufacturing method of SiC single crystal in which an a-plane growth and a c-plane growth (high offset angle growth) are combined.

FIGS. 6A to 6D are diagrams showing a comparison example of a manufacturing method of a SiC single crystal in which the a-plane growth and the c-plane growth (high offset angle growth) are combined. FIG. 6A shows a cross-sectional view of the first seed crystal. A first seed crystal 50 shown in FIG. 6A has a bottom surface, which is not parallel to the {0001} plane, and is a so-called "offset substrate". The first seed crystal 50 has a relatively large offset angle $\theta_1$ and is the high offset angle substrate. The first seed crystal 50 is a plate-like seed crystal (a-plane growth substrate), which is cut out from the crystal grown by the a-plane growth method. Therefore, the first seed crystal 50 has relatively large amount of the stacking faults (SF) including basal surface threading edge dislocations (BSTED) generated in parallel to the {0001} plane. Further, the first seed crystal 50 has the threading screw dislocation generation region (TSDGR), that is, the artificially generated fault portion formed at the uppermost portion of the upstream side in the offset direction.

Figure 6B:
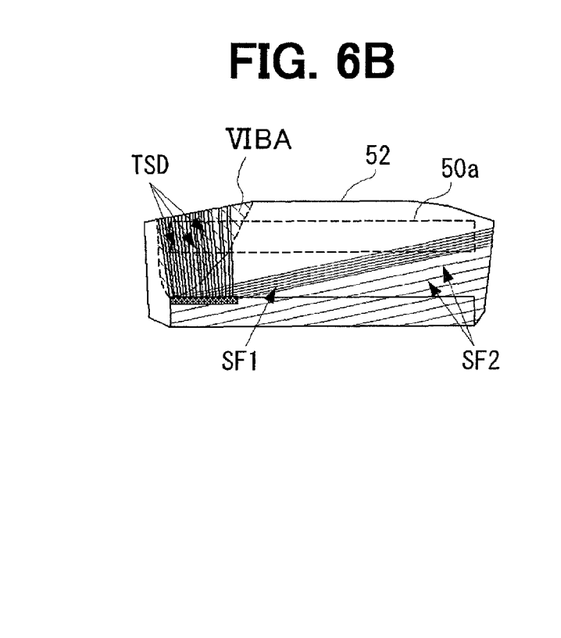

When the first seed crystal 50 described above is used in a first growth (first growth step), a first SiC single crystal 52 shown in FIG. 6B is obtained. During the growth, the threading screw dislocations (shown by arrow TSD in FIG. 6B) having a relatively high density are generated in the threading screw dislocation generation region, and are provided to the c-plane facet (shown by arrow VIBA in FIG. 6B). As a result, the generation of the heterogeneous polymorphous crystals due to insufficient threading screw dislocations in the c-plane facet is restricted. Further, a generation of the threading screw dislocations on the interface between the seed crystal and the growing crystal is restricted by the high offset angle growth.

However, in the high offset angle growth, the stacking faults (shown by arrow SF2 in FIG. 6B) are transferred from the seed crystal to the growing crystal. Further, stacking faults (shown by arrow SF1 in FIG. 6B) including basal surface threading edge dislocations, which are transferred to the downstream side in the offset direction, are easily generated in the threading screw dislocation generation region, which is formed to restrict the generation of the heterogeneous polymorphous crystals. When the offset angle increases, the stacking faults are generated more easily in the threading screw dislocation generation region.

Figure 6C:
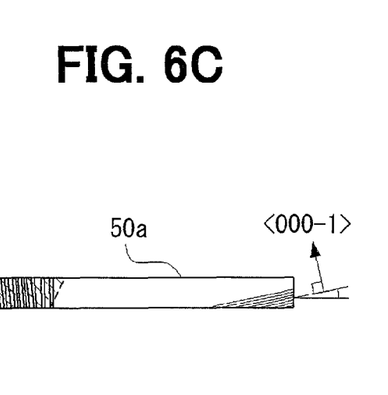

Next, a second seed crystal 50a is cut out from the first SiC single crystal 52 in such a manner that the offset angles $\theta_2$ and $\theta_1$ satisfy a relationship of $\theta_2 = \theta_1$ and the offset inclined directions are coincident with each other. FIG. 6C shows a cross-sectional view of the cutout second seed crystal 50a. FIG. 6E shows a cross-sectional view of a cutout second seed crystal 50b, which is treated to distort crystal lattices of the seed crystal at the uppermost portion of the upstream side in the offset direction shown by arrow VIEA. Each of the second seed crystals 50a and 50b respectively shown in FIG. 6C and FIG. 6E has a relatively large offset angle $\theta_2$, and is the low offset angle substrate. Additionally, each of the second seed crystals 50a and 50b has a high density of the threading screw dislocations, which are transferred from the first SiC single crystal 52, at the uppermost portion of the upstream side in the offset direction.

Figure 6D:
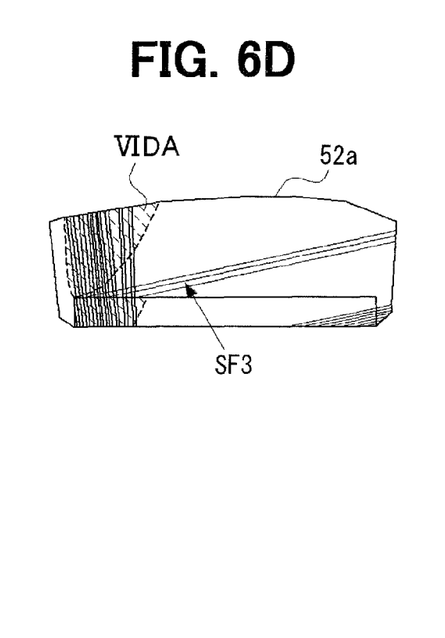
Figure 6E:
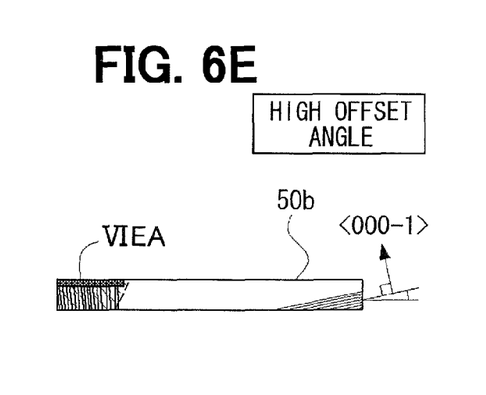
Figure 6F:
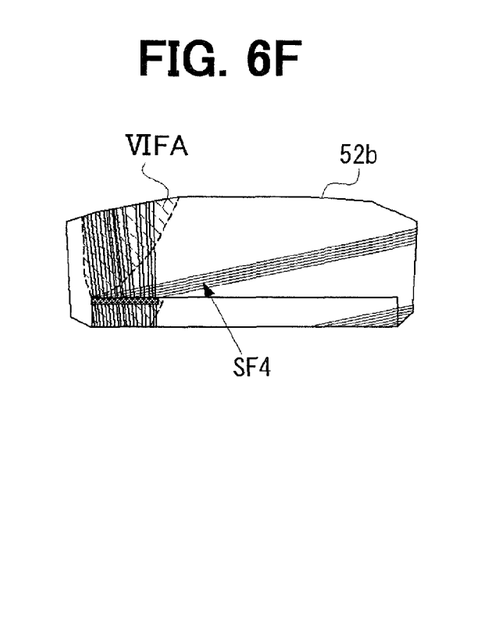

When the second seed crystal 50a or 50b described above is used in a second growth, a second SiC single crystal 52a or 52b respectively shown in FIG. 6D and FIG. 6F is obtained. During the growth, the threading screw dislocations having a relatively high density are generated in the threading screw dislocation generation region, and are provided to the c-plane facet (shown by arrow VIDA in FIG. 6D and shown by arrow VIFA in FIG. 6F). As a result, the generation of the heterogeneous polymorphous crystals due to insufficient threading screw dislocations in the c-plane facet is restricted.

However, when the high offset angle growth is performed during the second growth, the stacking faults (shown by arrow SF3 in FIG. 6D), which are transferred again from the threading screw dislocation region to the downstream side in the offset direction, are generated easily. Additionally, when the second seed crystal is treated to distort crystal lattices at the uppermost portion of the upstream side in the offset direction, the density of the stacking faults (shown by arrow SF4 in FIG. 6F) will increase further. Therefore, the manufacturing method, in which the a-plane growth and the c-plane growth (high offset angle growth) are combined, has a limitation in decreasing the density of the stacking faults.

In the high offset angle growth, a reason for the generation of the stacking faults is considered as followings.

Figure 7A:
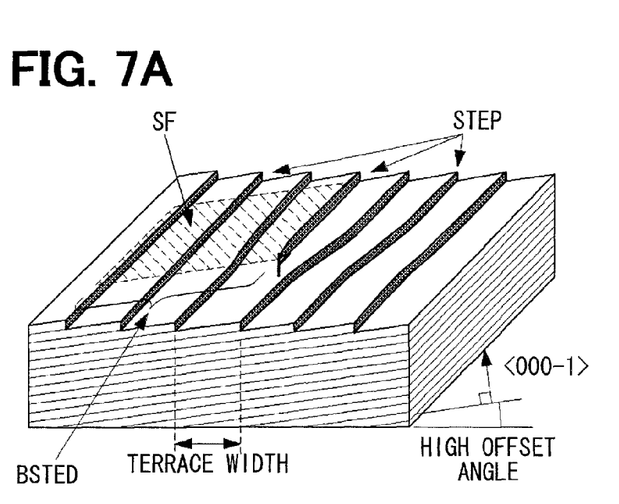
FIGS. 7A to 7D are diagrams showing growth steps during high offset angle growth.

As shown in FIG. 7A, in the c-plane growth, in the high offset angle growth, the terrace width is small. Therefore, when the crystal has a stacking fault (SF) therein, a forefront of the stacking fault is exposed on a surface of the terrace, which has a small width.

Figure 7B:
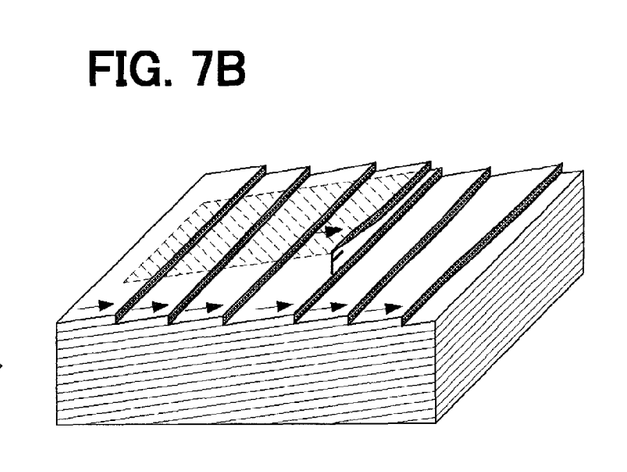
Figure 7C:
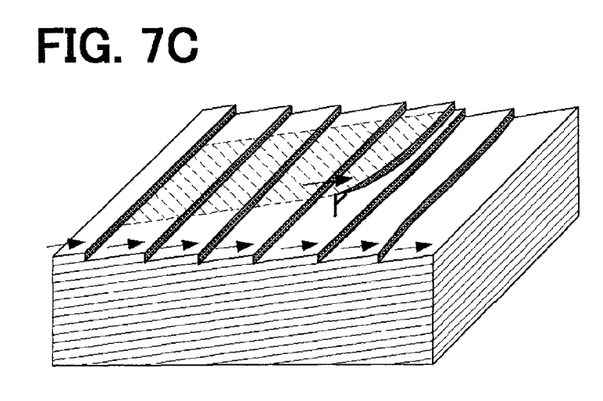
Figure 7D:
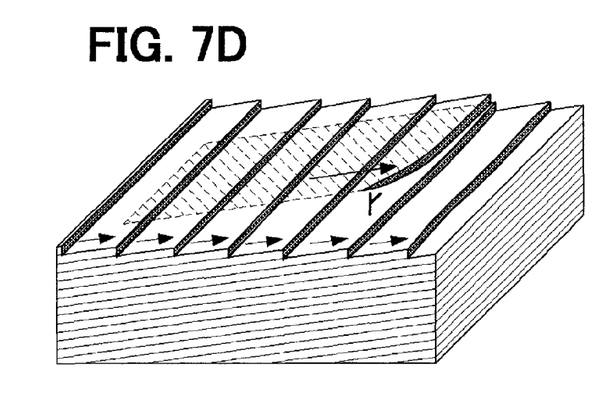

When the seed crystal described above is used in the c-plane growth, the forefront of the step is developed as shown in FIG. 7B. However, since the terrace width is small, the forefront of the step of the stacking fault can not be spirally twisted. Therefore, as shown in FIGS. 7A to 7D, the stacking faults are not converted to the threading screw dislocations, and transferred directly to the growing crystal with the growth of the crystal.

[4.3. High Offset Angle Growth and then Low Offset Angle Growth]

As described above, in a case where a seed crystal having low density of the threading screw dislocations is used in the c-plane growth, when the low offset angle growth is performed, the threading screw dislocations may be generated on the interface between the seed crystal and the growing crystal. In contrast, in a case where a seed crystal having low density of the threading screw dislocations is used in the c-plane growth, when the high offset angle growth is performed, the stacking faults may be generated in the threading screw dislocation generation region.

To solve above-described problem, in a case where the c-plane growth is repeatedly performed, when the offset angle of the seed crystal is set to decrease step by step, the density of the threading screw dislocation and the density of the stacking faults are decreased at the same time during the c-plane growth.

That is, at the first c-plane growth after the a-plane growth, the offset angle of the seed crystal is set to a relatively large value so that a conversion from the basal surface threading edge dislocations to the stacking faults are restricted as shown in FIGS. 7A to 7D. As a result, the stacking faults directly flow to the downstream side in the offset direction, and are removed to the outside of the growing crystal. This effect increases with an increasing offset angle. In this case, stacking faults including basal surface threading edge dislocation may be generated in the threading screw dislocation generation region. Similarly, the stacking faults generated in the threading screw dislocation generation region flow to the downstream side in the offset direction, and are removed outside of the growing crystal.

In this case, the basal surface threading edge dislocations generated in the threading screw dislocation generation region have a relatively high density. Therefore, some of the basal surface threading edge dislocations may convert to the threading screw dislocations. However, the amount of the threading screw dislocations, which are converted from the basal surface threading edge dislocations, is smaller than the amount of the threading screw dislocations generated on the interface between the seed crystal and the growing crystal when the low offset angle growth is performed.

After the high offset angle growth is performed, a seed crystal is cut out from the growing crystal so that the seed crystal has a relatively small offset angle. When the seed crystal having the relatively small offset angle is used to grow single crystal, the density of the stacking faults, which are transferred from the threading screw dislocation generation region to the growing crystal, may be decreased. This effect increases with a decreasing offset angle. Additionally, when the seed crystal is treated to distort crystal lattices at the threading screw dislocation generation region, the generation of the stacking faults is restricted if the offset angle is set to a sufficiently small value.

As described above, first the a-plane growth is performed. Then the c-plane growth is performed with a high offset angle. After the c-plane growth, a seed crystal is cut out to have a small offset angle and is grown. By above-described growth method, the threading screw dislocations and the stacking faults are decreased at the same time.

Further, in a case where a growing crystal having a sufficient growth height compared with a size (a diameter when formed in a circular shape) of the seed crystal, the offset angle may be set to a small value at one time in order to obtain a seed crystal having the same size with the first seed crystal.

However, in a case where the growth height is not sufficiently high, when a seed crystal having a largely different offset angle is cut out from the growing crystal, the offset angle of a seed crystal to be cut out next becomes small. In this case, as shown in FIGS. 2A to 2F, the size of the seed crystal may be maintained by decreasing the offset angle step by step.

Example 1

1. Sample Preparation

A SiC single crystal is grown by the manufacturing method shown in FIGS. 1A to 1D. That is, the SiC single crystal is grown by the a-plane method, and then two substrates (first seed crystal) are cut out from the SiC single crystal with the offset angle $\theta_1=8°$. Each of the two first seed crystals has the threading screw dislocation generation region formed on the uppermost portion of the upstream side in the offset direction. Each of the two first seed crystals is used to grow the SiC single crystal (first growth step).

Next, a substrate (second seed crystal) is cut out from one of the SiC single crystals grown in the first growth step with the offset angle $\theta_2=4°$. Additionally, the second seed crystal and the SiC single crystal, from which the second seed crystal is cut out, have the same offset inclined direction. Further, the second seed crystal is cut out from a region, which is sufficiently far from the first seed crystal, and the stacking faults in the region are removed to the outside of the growing crystal. The second seed crystal is used to grow the SiC single crystal (second growth step).

2. Test Method

Samples for X-ray topography are respectively cut out from the SiC single crystal obtained from the first growth step and the SiC single crystal obtained from the second growth step. Each of the samples is cut out in such a manner that a plane of the sample is in parallel to the growth direction, and another plane of the sample is in parallel to the offset direction. The samples are examined by an X-ray topography method.

3. Result

In the SiC single crystal obtained from the first growth step, very small amount of threading screw dislocations generated on the interface between the seed crystal and the growing crystal are examined. Additionally, the stacking faults flowing from the threading screw dislocation generation region to the downstream side in the offset direction are examined.

In the SiC single crystal obtained from the second growth step, threading screw dislocations are not generated on the interface between the seed crystal and the growing crystal, and very small amount of stacking faults flowing from the threading screw dislocation generation region to the downstream side in the offset direction are examined. In the SiC single crystal obtained from the second growth step, when a density of the threading screw dislocations in a region other than the threading screw dislocation generation region is examined, the density is 1 to $10/cm^2$.

Example 2

1. Sample Preparation

A SiC single crystal is grown by the manufacturing method shown in FIGS. 2A to 2F. That is, the SiC single crystal is grown by the a-plane method, and then three substrates (first seed crystal) are cut out from the SiC single crystal with the offset angle $\theta_1=8°$. Each of the three first seed crystals has the threading screw dislocation generation region formed on the uppermost portion of the upstream side in the offset direction. Each of the three first seed crystals is used to grow the SiC single crystal (first growth step).

Next, two substrates (second seed crystal) are cut out from two of the SiC single crystals grown in the first growth step with the offset angle $\theta_2=6°$. Additionally, every second seed crystal and every SiC single crystal from which the second seed crystal is cut out have the same offset inclined direction. Further, every second seed crystal is cut out from a region, which is sufficiently far from the first seed crystal, and the stacking faults in the region are removed to the outside of the growing crystal. The two second seed crystals are used to grow the SIC single crystals (second growth step).

Further, a substrate (third seed crystal) is cut out from one of the second SiC single crystals grown in the second growth step with the offset angle $\theta_3=4°$. Additionally, the third seed crystal and the SiC single crystal from which the third seed crystal is cut out have the same offset inclined direction. Further, the third seed crystal is cut out from a region, which is sufficiently far from the second seed crystal, and the stacking faults in the region are removed to the outside of the growing crystal. The third seed crystal is used to grow the SiC single crystal (third growth step).

2. Test Method

Samples for X-ray topography are respectively cut out from the SiC single crystal obtained from the first growth step, the SiC single crystal obtained from the second growth step and the SIC single crystal obtained from the third growth step. Each of the samples is cut out in such a manner that a plane of the sample is in parallel to the growth direction, and another plane of the sample is in parallel to the offset direction. The samples are examined by the X-ray topography method.

3. Result

In the SiC single crystal obtained from the first growth step, very small amount of threading screw dislocations generated on the interface between the seed crystal and the growing crystal are examined. Additionally, the stacking faults flowing from the threading screw dislocation generation region to the downstream side in the offset direction are examined. Further, since the growth height of the SiC single crystal is not sufficiently high, the stacking faults are not completely removed to the outside of the growing crystal.

In the SiC single crystal obtained from the second growth step, a region, which is on the surface of the second seed crystal and the stacking faults in the region are removed to the outside of the growing crystal, has no threading screw dislocations generated on the interface between the seed crystal and the growing crystal. Additionally, a region, which is located at the downstream side in the offset direction and has some remained stacking faults, has a little threading screw dislocations generated on the interface between the seed crystal and the growing crystal. Further, in the threading screw dislocation generation region formed at the upstream side in the offset direction, a transfer of stacking faults having a low density is examined.

In the SiC single crystal obtained from the third growth step, the threading screw dislocations formed at the downstream side in the offset direction in the second growth step are transferred directly to the growing crystal. However, new threading screw dislocations are not generated on the interface between the seed crystal and the growing crystal. Additionally, very small amount of stacking faults are transferred from the threading screw dislocation generation region to the downstream side in the offset direction. In the SiC single crystal obtained from the third growth step, when a density of the threading screw dislocations in a region other than the threading screw dislocation generation region is examined. In a portion correspondent to a region in which the stacking faults of the second seed crystal are remained, the density of the threading screw dislocations is a little high. In the other portion, the density of the threading screw dislocations is 1 to $10/cm^2$.

Example 3

1. Sample Preparation

A SiC single crystal is grown by the manufacturing method shown in FIGS. 3A to 3D. That is, the SiC single crystal is grown by the a-plane method, and then two pyramid-like onset substrates (first seed crystal) are cut out from the SiC single crystal with the offset angle $\theta_1=8°$ in such a manner that in each of the substrate, the uppermost portion of the upstream side in the offset direction corresponds to a central part of the substrate. Each of the two first seed crystals has the threading screw dislocation generation region formed in the central part of the substrate including the uppermost portion of the upstream side in the offset direction. Each of the two first seed crystals is used to grow the SiC single crystal (first growth step).

Next, a pyramid-like onset substrate (second seed crystal) is cut out from one of the SiC single crystals grown in the first growth step with the offset angle $\theta_2=4°$ in such a manner that the uppermost portion of the upstream side in the offset direction corresponds to a central part of the second seed crystal. Additionally, the second seed crystal is cut out from a region, which is sufficiently far from the first seed crystal, and the stacking faults in the region are removed to the outside of the growing crystal. The second seed crystal is used to grow the SiC single crystal (second growth step).

2. Test Method

Samples for X-ray topography are respectively cut out from the SiC single crystal obtained from the first growth step and the SiC single crystal obtained from the second growth step. Each of the samples is cut out in such a manner that a plane of the sample is in parallel to the growth direction, and another plane of the sample is in parallel to the offset direction. The samples are examined by the X-ray topography method.

3. Result

In the SiC single crystal obtained from the first growth step, very small amount of threading screw dislocations generated on the interface between the seed crystal and the growing crystal are examined. Additionally, the stacking faults flowing from the threading screw dislocation generation region to the downstream side in the offset direction are examined.

In the SiC single crystal obtained from the second growth step, new threading screw dislocations are not generated on the interface between the seed crystal and the growing crystal, and very small amount of stacking faults flowing from the threading screw dislocation generation region to the downstream side in the offset direction are examined. In the SiC single crystal obtained from the second growth step, when a density of the threading screw dislocations in a region other than the threading screw dislocation generation region is examined, the density is 1 to 10/cm².

Comparison Example 1

1. Sample Preparation

A substrate (first seed crystal) is cut out from a SiC single crystal grown by the a-plane method with the offset angle $\theta_1=4°$. The first seed crystal has the threading screw dislocation generation region formed on the uppermost portion of the upstream side in the offset direction. The first seed crystal is used to grow the SiC single crystal. Next, the cutting out of a new seed crystal with the offset angle $\theta_1=4°$ and growing a new SiC single crystal with the cutout seed crystal is repeated for several times.

2. Test Method

Similarly to the example 1, a sample is obtained and examined by the X-ray topography method.

3. Result

In the first growth step, large amount of threading screw dislocations are generated on the interface between the seed crystal and the growing crystal. The threading screw dislocations are transferred to the SiC single crystal grown in the second or later growth step. In the SiC single crystal grown in each growth step, when a density of the threading screw dislocations in a region other than the threading screw dislocation generation region is examined, the density is 10 to 100/cm².

Further, the manufacturing method of the SiC single crystal disclosed in the present invention may also be used as a manufacturing method of a SiC single crystal, which is used as a semiconductor material of an ultra-low power loss device.

According to an aspect of the present disclosure, a manufacturing method of a SiC single crystal includes a first growth process and a re-growth process. In the first growth process, a first seed crystal made of SiC is used to grow a first SiC single crystal. In the re-growth process, a plurality of growth steps are performed for (n−1) times. In a k-th growth step, a k-th seed crystal is cut out from a grown (k−1)-th SiC single crystal, and the k-th seed crystal is used to grow a k-th SiC single crystal. The n is natural number and is equal to or larger than 2, and the k is natural number and is in a range between 2 and n. When an offset angle of a growth surface of the first seed crystal is defined as $\theta_1$, the offset angle $\theta_1$ is larger than 4 degrees and equal to or smaller than 30 degrees. When an offset angle of a growth surface of the k-th seed crystal is defined as $\theta_k$, at least in one of the plurality of growth steps, the offset angle $\theta_k$ is smaller than the offset angle $\theta_{k-1}$. The offset angle $\theta_n$ is smaller than the offset angle $\theta_1$. Each of the first to n-th seed crystals has a threading screw dislocation generation region formed on an uppermost portion of the upstream side in the offset direction.

In the above manufacturing method, in the first growth process, when the first seed crystal, which is used to grow the first SiC single crystal, has a relatively small offset angle $\theta_1$, more threading screw dislocations included in the first seed crystal are converted to the stacking faults, and are removed to the outside of the growing crystal. Thus, compared with the first seed crystal, the first SiC single crystal has a lower density of the threading screw dislocations even though the first seed crystal is cut out from a low-quality SiC single crystal having a high density of the threading screw dislocations.

Further, in the k-th growth step, when the k-th seed crystal, which is cut out from the grown (k−1)-th SiC single crystal to grow the k-th SiC single crystal, has a smaller offset angle $\theta_k$ than the offset angle $\theta_{k-1}$ of the (k−1)-th seed crystal, a generation of the stacking faults is restricted in the threading screw dislocation generation region. Additionally, since most of the stacking faults are removed to the outside of the growing crystal in a prior growth step, the amount of the threading screw dislocations converted from the remained stacking faults is small.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A manufacturing method of a SiC single crystal comprising:
    a first growth process in which a first seed crystal made of SiC is used to grow a first SiC single crystal; and
    a re-growth process in which a plurality of growth steps are performed for (n−1) times, in a k-th growth step, a k-th seed crystal is cut out from a grown (k−1)-th SiC single crystal, and the k-th seed crystal is used to grow a k-th SiC single crystal,
    wherein the n is natural number and is equal to or larger than 2, and the k is natural number and is in a range between 2 and n,
    wherein an offset angle of a growth surface of the first seed crystal is defined as $\theta_1$, the offset angle $\theta_1$ is larger than 4 degrees and equal to or smaller than 30 degrees,
    wherein an offset angle of a growth surface of the k-th seed crystal is defined as $\theta_k$, at least in one of the plurality of growth steps, the offset angle $\theta_k$ is smaller than the offset angle $\theta_{k-1}$,
    wherein the offset angle $\theta_n$ is smaller than the offset angle $\theta_1$, and
    wherein each of the first to n-th seed crystals has a threading screw dislocation generation region formed on an uppermost portion of an upstream side in an offset direction.

2. The manufacturing method according to claim 1,
    wherein the uppermost portion of the upstream side in the offset direction is a portion at which a crystallographically uppermost {0001} plane is located, and the portion is located at a side to which a projected vector defined by projecting a normal vector of a {0001} plane on the growth surface of the k-th seed crystal points.

3. The manufacturing method according to claim 1,
    wherein an angle difference $\Delta\theta_n$ is defined by subtracting the offset angle $\theta_1$ from the offset angle $\theta_n$, the angle difference $\Delta\theta_n$ is smaller than −2 degrees.

4. The manufacturing method according to claim 1,
    wherein the angle difference $\Delta\theta_n$ is defined by subtracting the offset angle $\theta_1$ from the offset angle $\theta_n$, the angle difference $\Delta\theta_n$ is smaller than −4 degrees.

5. The manufacturing method according to claim 1,
    wherein the offset angle $\theta_n$ is equal to or smaller than 15 degrees.

6. The manufacturing method according to claim 1, wherein the offset angle $\theta_n$ is equal to or smaller than 8 degrees.

7. The manufacturing method according to claim 1, wherein the offset angle $\theta_n$ is equal to or smaller than 4 degrees.

8. The manufacturing method according to claim 1, wherein the offset angle $\theta_1$ is equal to or larger than 8 degrees.

9. The manufacturing method according to claim 1, wherein in the k-th growth step, an angle difference between an offset inclined direction of the k-th seed crystal on the {0001} plane and an offset inclined direction of the (k−1)-th seed crystal on the {0001} plane is within a range from −45 degrees to +45 degrees.

10. The manufacturing method according to claim 1, wherein in the k-th growth step, the offset angle $\theta_k$ is smaller than the offset angle $\theta_{k-1}$.

11. The manufacturing method according to claim 1, Wherein the n is equal to 2.

12. The manufacturing method according to claim 1, wherein in the k-th growth step, when the offset angle $\theta_k$ is equal to or smaller than 4 degrees, the k-th seed crystal is cut out from the (k−1)-th SiC single crystal in such a manner that stacking faults, which are transferred from the (k−1)-th seed crystal to the grown (k−1)-th SiC single crystal, are not exposed on the growth surface of the k-th seed crystal.

13. The manufacturing method according to claim 1, wherein the threading screw dislocation generation region is formed by performing a process for disarranging a crystal structure on the growth surface of the k-th seed crystal.

14. The manufacturing method according to claim 13, wherein the process for disarranging the crystal structure is performed by a mechanical processing.

* * * * *